(12) United States Patent
Chen et al.

(10) Patent No.: US 8,208,671 B2
(45) Date of Patent: Jun. 26, 2012

(54) MICROPHONE WITH BACKSIDE CAVITY THAT IMPEDES BUBBLE FORMATION

(75) Inventors: Thomas Chen, Cambridge, MA (US); Michael Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 506 days.

(21) Appl. No.: 12/355,432

(22) Filed: Jan. 16, 2009

(65) Prior Publication Data

US 2009/0180647 A1    Jul. 16, 2009

Related U.S. Application Data

(60) Provisional application No. 61/021,420, filed on Jan. 16, 2008.

(51) Int. Cl.
*H04R 19/04* (2006.01)
*G01L 9/00* (2006.01)

(52) U.S. Cl. ......................... 381/360; 257/419

(58) Field of Classification Search .................... 438/53; 257/419, E29.324; 381/348, 360
See application file for complete search history.

(56) References Cited

U.S. PATENT DOCUMENTS

| 4,922,471 A | 5/1990 | Kuehnel |
| 5,870,482 A | 2/1999 | Loeppert et al. |
| 6,859,542 B2 * | 2/2005 | Johannsen et al. ............ 381/174 |
| 2005/0254673 A1 | 11/2005 | Hsieh et al. |

* cited by examiner

*Primary Examiner* — Calvin Lee
(74) *Attorney, Agent, or Firm* — Sunstein Kann Murphy & Timbers LLP

(57) ABSTRACT

A MEMS microphone has a backplate, a diaphragm movable relative to the backplate, and a backside cavity adjacent to the backplate or the diaphragm. The backside cavity has sidewalls with at least one rib protruding inward toward a center of the backside cavity.

18 Claims, 7 Drawing Sheets

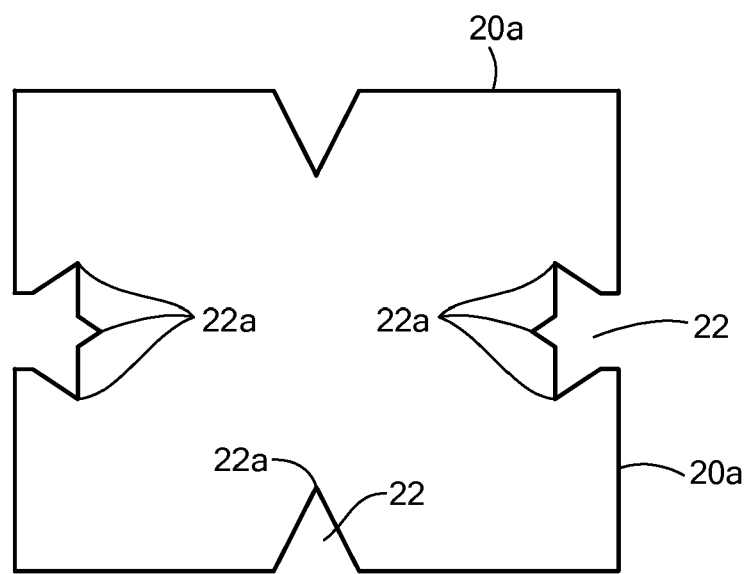
FIG. 3E
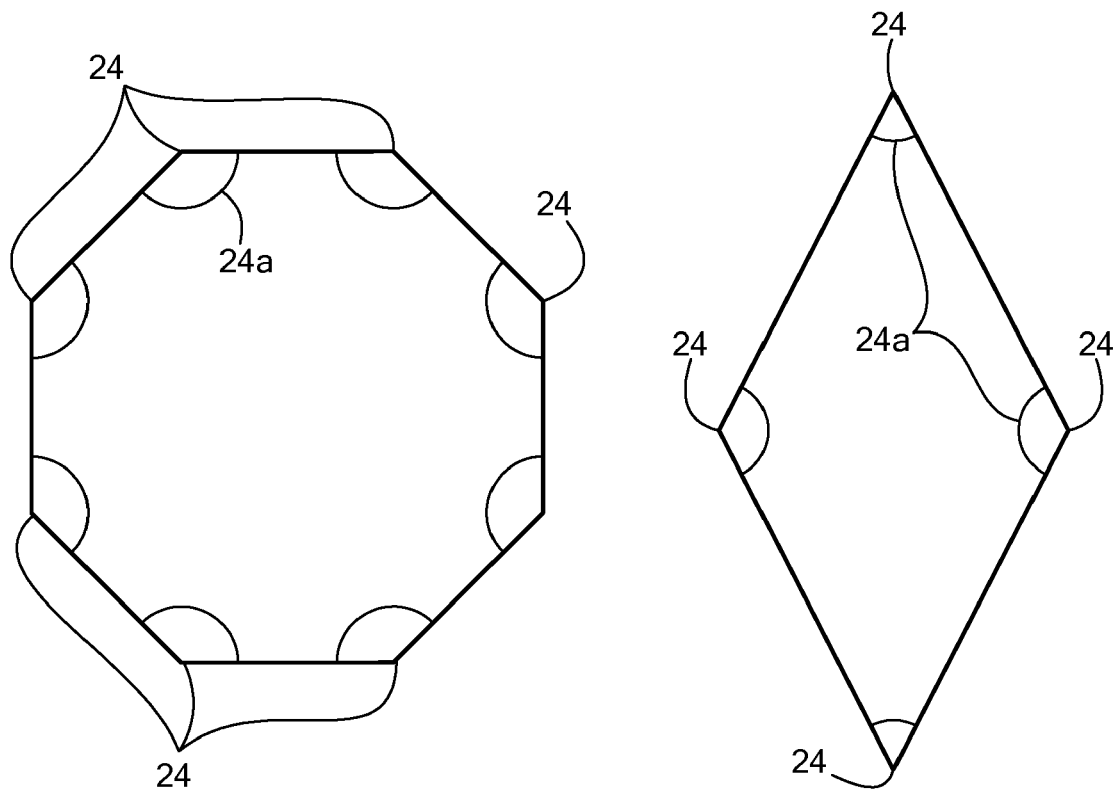
FIG. 4A  FIG. 4B

MICROPHONE WITH BACKSIDE CAVITY THAT IMPEDES BUBBLE FORMATION

CROSS-REFERENCE TO RELATED APPLICATIONS

This patent application claims priority to U.S. Provisional Patent Application No. 61/021,420 filed Jan. 16, 2008, entitled MICROPHONE WITH SUPPORTING BACKSIDE CAVITY, the disclosure of which is incorporated by reference herein in its entirety.

FIELD OF THE INVENTION

The invention generally relates to microphones and, more particularly, the invention relates to backside cavities in silicon or MEMS microphones.

BACKGROUND OF THE INVENTION

A conventional MEMS microphone typically has a static substrate/backplate that, together with a flexible diaphragm, forms a variable capacitor. For example, the backplate may be formed from single crystal silicon (e.g., a part of a silicon-on-insulator wafer or a bulk silicon wafer), while the diaphragm is formed from deposited polysilicon. To facilitate operation, the backplate has a plurality of through-holes that lead to a backside cavity. The backside cavity often has a generally rounded shape.

During fabrication, the interior walls of the through-holes sometimes have an oxide that must be removed. To remove this oxide, some processes often immerse the backplate in a liquid bath of hydrofluoric acid. Specifically, such processes known to the inventors typically place the apparatus that is to become the microphone into the liquid bath in a "substrate first" manner; namely, the diaphragm (which is not necessarily immersed) is vertically above the substrate within the bath receptacle, although other configurations may be used.

Surprisingly, despite the relatively large size of the backside cavity, the liquid often cannot penetrate into the backside cavity and thus, cannot access the through-holes. Specifically, the inventors have noticed that the liquid often forms a bubble around the opening of the backside cavity. Accordingly, absent some additional measures, such as directly applying a mechanical force to the bubble (e.g., blowing air toward the backside cavity at a sufficient velocity to break the bubble), the liquid does not enter the through-holes and, consequently, cannot adequately remove the oxide.

In addition, a generally rounded backside cavity often does not adequately support the backplate. When not adequately supported, a backplate undesirably may droop or bow.

SUMMARY OF THE INVENTION

In accordance with one embodiment of the invention, a MEMS microphone has a backplate, a diaphragm movable relative to the backplate, and a backside cavity adjacent to the backplate or the diaphragm. The backside cavity has sidewalls with at least one rib protruding inward toward a center of the backside cavity. In other embodiments, the backside cavity has a non-rectangular shape and sidewalls with one or more vertices.

In accordance with another embodiment of the invention, a method of forming a MEMS microphone forms a backplate, forms a diaphragm movable relative to the backplate, and forms a backside cavity adjacent to the backplate or the diaphragm. The backside cavity has sidewalls with one or more ribs protruding inward toward a center of the backside cavity.

In some embodiments, the ribs may be curved, the ribs may have one or more points, or some ribs may be curved and some may have one or more points. The sidewalls of the backside cavity may have numerous ribs protruding toward the center forming a serrated pattern. The ribs may be formed near the bottom opening of the backside cavity. The ribs may extend along the sidewall from the bottom opening of the backside cavity to the top of the backside cavity. The ribs may, at least in part, support the backplate. The sidewalls may be curved, substantially straight, or both.

In some embodiments, the method may further include partially immersing the backplate in a liquid. The ribs are shaped to substantially prevent bubble formation when immersed in the liquid and permit the liquid into the backside cavity. The backplate may have at least one through-hole that allows fluid to move from the backside cavity into the area below the diaphragm. The walls of this through-hole may have a material that is soluble in the liquid. Accordingly, the method may at least partially immerse the backplate in the liquid to enable the liquid to contact the walls of the through-hole. Due to this access, the liquid may remove the material from the walls. The material may include an oxide and the liquid may include a hydrofluoric acid.

In some embodiments, one or more vertices may form an angle facing the interior of the backside cavity. The angle may be less than about 90 degrees.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIGS. 3A-3E schematically show cross-sectional views of different backside cavity shapes having one or more ribs configured in accordance with illustrative embodiments of the invention.

FIGS. 4A and 4B schematically show cross-sectional views of backside cavity shapes having one or more vertices and non-rectangular shapes configured in accordance with illustrative embodiments of the invention.

DESCRIPTION OF ILLUSTRATIVE EMBODIMENTS

In illustrative embodiments, the backside cavity of a MEMS microphone is shaped in a manner that reduces the likelihood of bubble formation when immersed in a liquid, such as an etchant bath, e.g., hydrofluoric acid. To that end, the backside cavity has sidewalls that may include at least one rib protruding inward toward the center of the cavity. Alternatively, or in addition, the backside cavity may have a non-rectangular shape with one or more vertices. Such embodiments also may further support the backplate, consequently reducing backplate bowing. Details of illustrative embodiments are discussed below.

Figure 1A:
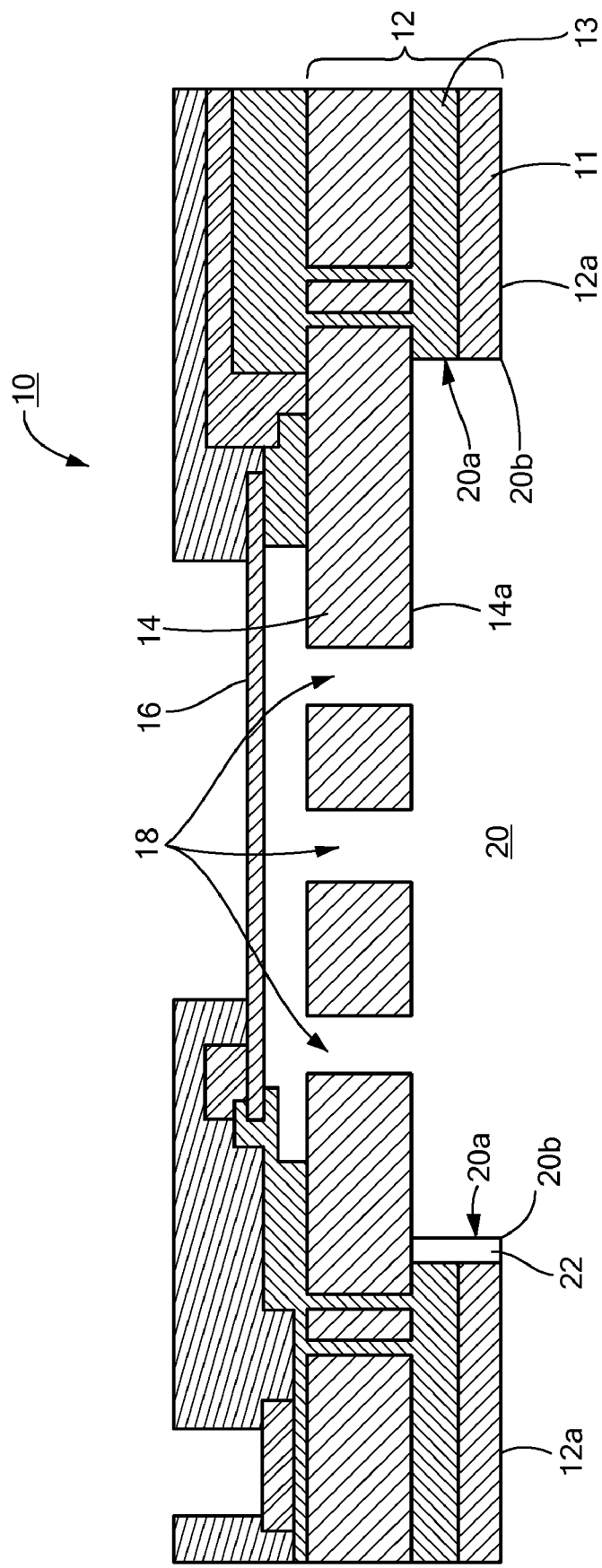
FIG. 1A schematically shows a cross-sectional view of a MEMS microphone that may be configured in accordance with illustrative embodiments of the invention.
Figure 1B:
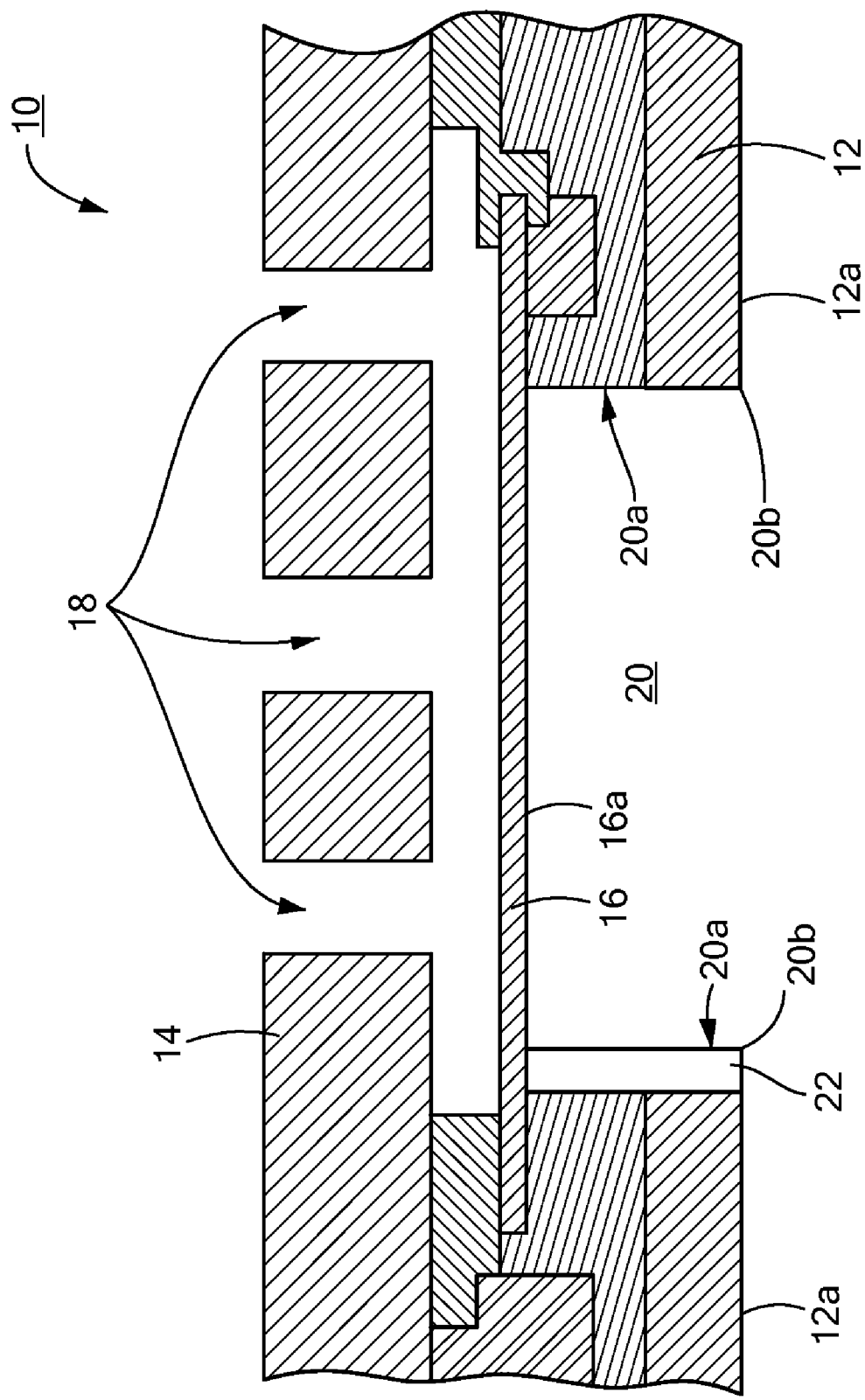
FIG. 1B schematically shows a cross-sectional view of another MEMS microphone configuration that may be configured in accordance with illustrative embodiments of the invention.

FIG. 1A schematically shows a cross-sectional view of an unpackaged microelectromechanical system (MEMS) microphone 10 (also referred to as a "microphone chip"). FIG. 1B schematically shows a cross-sectional view of another MEMS microphone 10 configuration. These figures are discussed simply to detail some exemplary components that may make up a microphone produced in accordance with various embodiments.

In one embodiment, as shown in FIG. 1A, the microphone chip 10 has a chip base/substrate 12, one portion of which forms a static backplate 14. The microphone 10 also includes a flexible diaphragm 16 movable relative to the backplate 14. The backplate 14 and diaphragm 16 form a variable capacitor. In illustrative embodiments, the backplate 14 is formed from single crystal silicon (e.g., a part of a silicon-on-insulator wafer or a bulk silicon wafer), while the diaphragm 16 is formed from deposited polysilicon. In other embodiments, however, the backplate 14 and diaphragm 16 may be formed from different materials. For example, the backplate 14 may be formed from a conductive material other than silicon. To facilitate operation, the backplate 14 has a plurality of through-holes 18 that lead to a specially configured backside cavity 20 having sidewalls 20a shaped in accordance with illustrative embodiments.

It should be noted that the chip substrate 12, which may include the backplate 14, can be below the diaphragm 16 (from the perspective of FIG. 1A), or in some other orientation relative to the diaphragm 16 depending on the orientation of the MEMS microphone 10. Thus, in the present discussion, perspective is based on the orientation of the drawings of the MEMS microphone 10. In the embodiment shown in FIG. 1A, the substrate 12 includes the backplate 14 and other structures, such as the bottom wafer 11 and buried oxide layer 13 of an SOI wafer. A portion of the substrate 12 also forms a backside cavity 20 extending from the bottom 12a of the substrate 12 to the bottom 14a of the backplate 14. The backside cavity 20 has sidewalls 20a that form an outer perimeter of the cavity 20. The sidewalls 20a may have at least one rib 22 protruding inward toward the center of the cavity 20. Alternatively, or in addition, the sidewalls 20a may have one or more vertices 24 (e.g., shown in FIGS. 2A-4B) giving the cross-sectional view of the backside cavity 20 a non-rectangular shape. As discussed in more detail below, the rib or ribs 22 may aid in the support of the backplate 14.

Although FIG. 1A shows the backplate 14 between the diaphragm 16 and the backside cavity 20, the microphone 10 may have other configurations. For example, as shown in FIG. 1B, the diaphragm 16 may be between the backplate 14 and the backside cavity 20. In this case, the backside cavity 20 is adjacent to the diaphragm 16 and the substrate 12 forms a portion of the backside cavity 20 extending from the bottom 12a of the substrate 12 to the bottom 16a of the diaphragm 16. For simplicity, the remaining discussion is directed to FIG. 1A, although either configuration, or other configurations, may be used.

In operation, audio signals cause the diaphragm 16 to vibrate, thus varying the distance between the diaphragm 16 and the backplate 14 and producing a changing capacitance. Conventional on-chip or off-chip circuitry (not shown) converts this changing capacitance into electrical signals that can be further processed. This circuitry may be secured within the same package as the microphone 10, or within another package.

In accordance with illustrative embodiments of the invention, the backside cavity 20 has a specialized shape that, when compared to prior art rounded or rectangular backside cavities, should enable liquid to reach the area of the through-holes 18 when immersed in a liquid bath 26 (e.g., see FIG. 6, discussed below). In other words, the shape of the backside cavity 20 should mitigate the likelihood that a bubble forms at its bottom opening/mouth 20b.

Figure 2A:
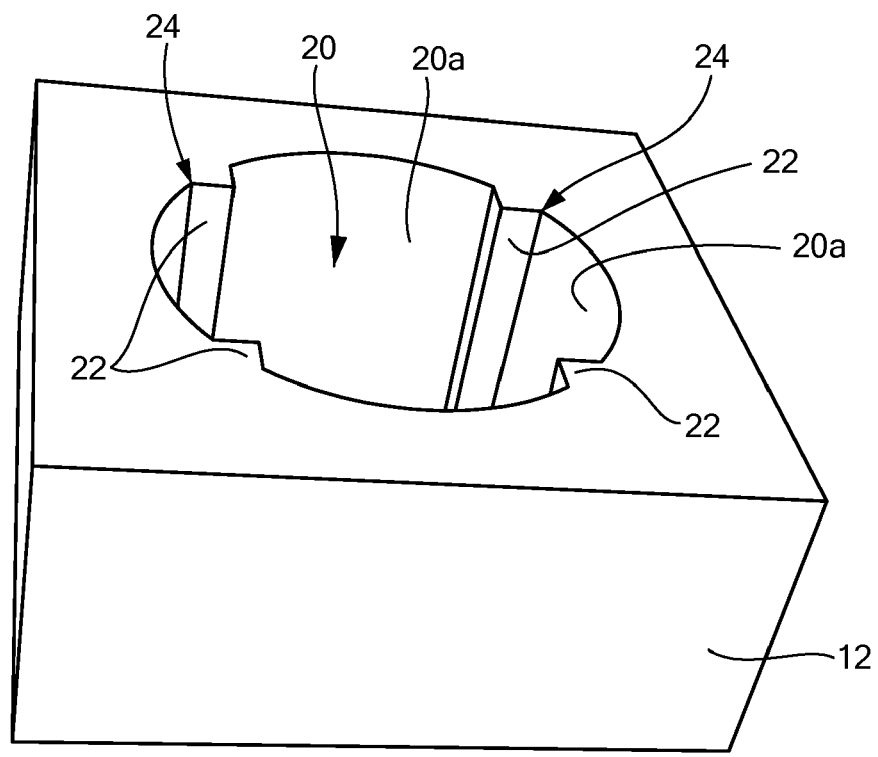
FIGS. 2A and 2B schematically show a perspective view of a substrate with a backside cavity having a plurality of ribs in accordance with illustrative embodiments of the invention.
Figure 2B:
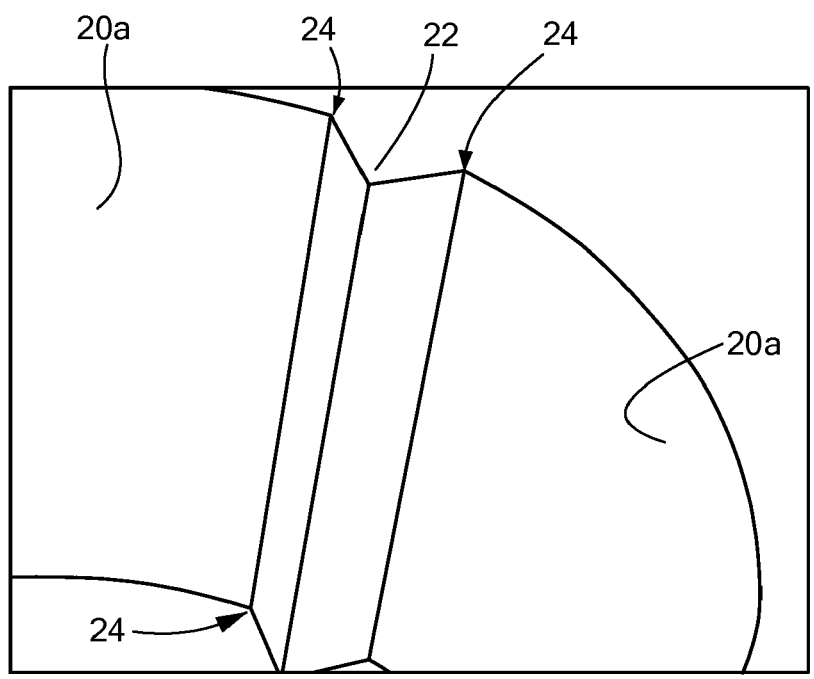

This may be accomplished by providing one or more ribs 22 in the sidewalls 20a of the backside cavity 20 protruding inward toward the center of the cavity 20. For example, FIG. 2A schematically shows a perspective view of a substrate with a backside cavity 20 having a plurality of ribs 22 and FIG. 2B shows an exploded view of one of the ribs 22. As shown, the ribs 22 form vertices 24 with the sidewalls 20a and protrude inward toward the center of the cavity 20. This protrusion should overcome the non-wetting effect of the surface tension of a liquid, such as an etchant (e.g., hydrofluoric acid) introduced at the bottom opening 20b of the backside cavity 20.

The one or more ribs 22 may be present solely at the bottom opening 20b of the backside cavity 20. Alternatively, the one or more ribs 22 may extending along the entire sidewall 20a (as shown in FIGS. 1A, 1B, 2A, and 2B) from the bottom opening 20b of the backside cavity 20 toward the top of the backside cavity 20 (e.g., the bottom 14a of the backplate 14 or the bottom 16a of the diaphragm 16). In some embodiments, a combination of these two rib 22 configurations may be used. For example, one or more ribs 22 may be present solely at the bottom opening 20b and one or more additional ribs 22 may extend along the entire sidewall 20a.

When there are one or more ribs 22 present toward the top of the backside cavity 20, the ribs 22 may effectively form an additional support for the backplate 14, thus mitigating backplate bowing. For example, in illustrative embodiments, the backplate 14 bows no more than about one micron and, preferably, much less than one micron. The term "bowing" essentially means the distance between 1) the intended position of the backplate 14 if there were no backplate drooping (measured at the bottom 14a of the backplate 14) and 2) the final location of the lowest portion of the bottom 14a of the backplate 14 (in the direction away from the diaphragm 16).

Although FIGS. 2A and 2B show a backside cavity 20 having curved sidewalls 20a and four, symmetric ribs 22, other configurations may be used. For example, FIGS. 3A through 3E show various cross-sectional views of backside cavities 20 having one or more ribs 22. As shown, the sidewalls 20a of the backside cavity 20 may be curved, substantially straight, or both. In addition, the ribs 22 may have one or more points 22a that are sufficiently sharp in order to overcome the surface tension of the liquid, thus permitting the liquid to wet the interior of the backside cavity 20 and, ultimately, the through-holes 18. Alternatively, or in addition, the ribs 22 may be rounded. Also, the shapes of the sidewalls 20a and/or the ribs 22 of the backside cavity 20 are not necessarily symmetric and any number of ribs 22 may be used.

Figure 3A:
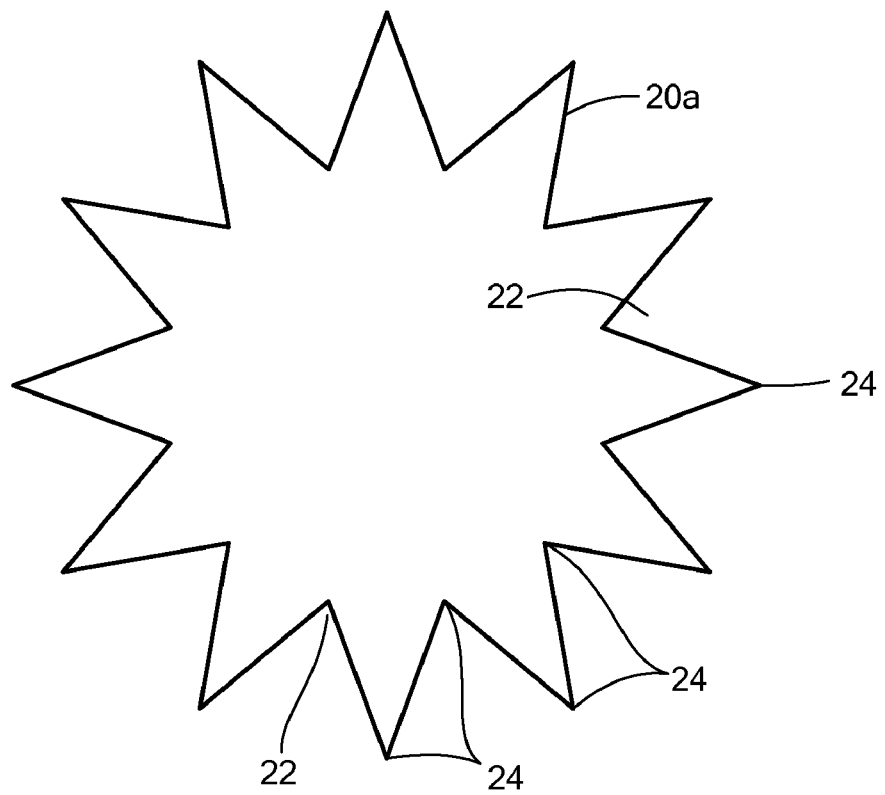
Figure 3B:
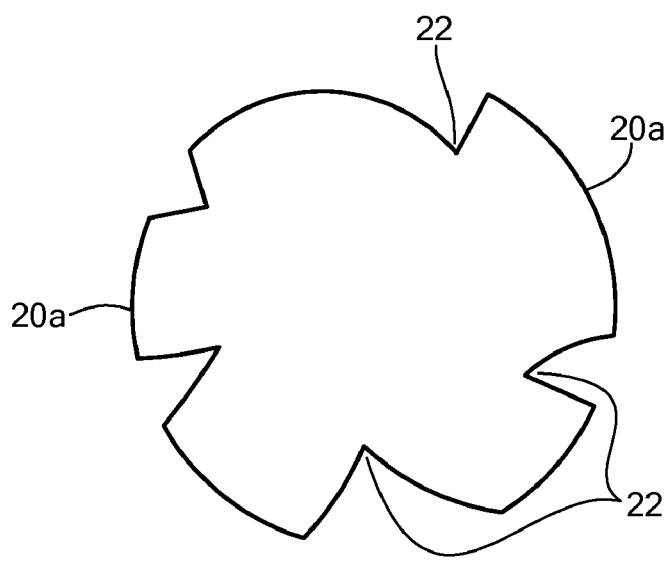
Figure 3C:
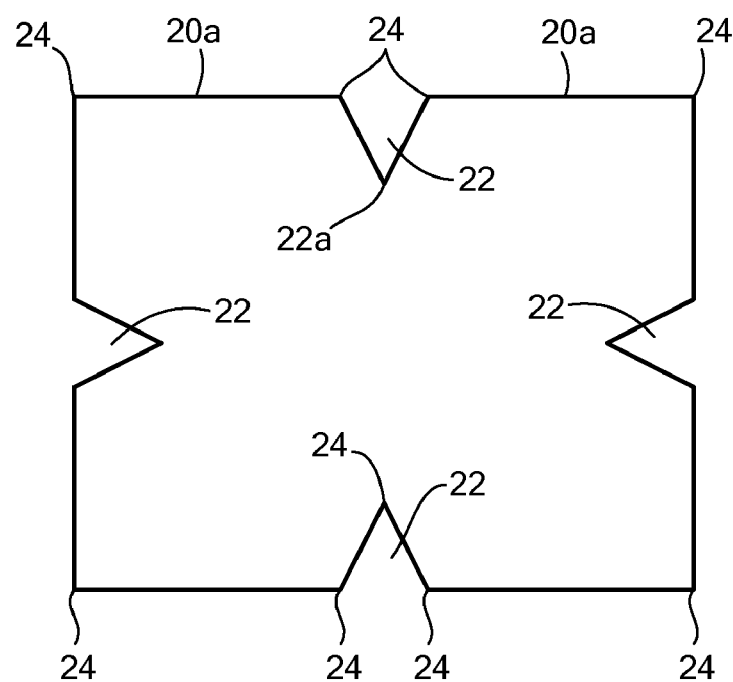
Figure 3D:
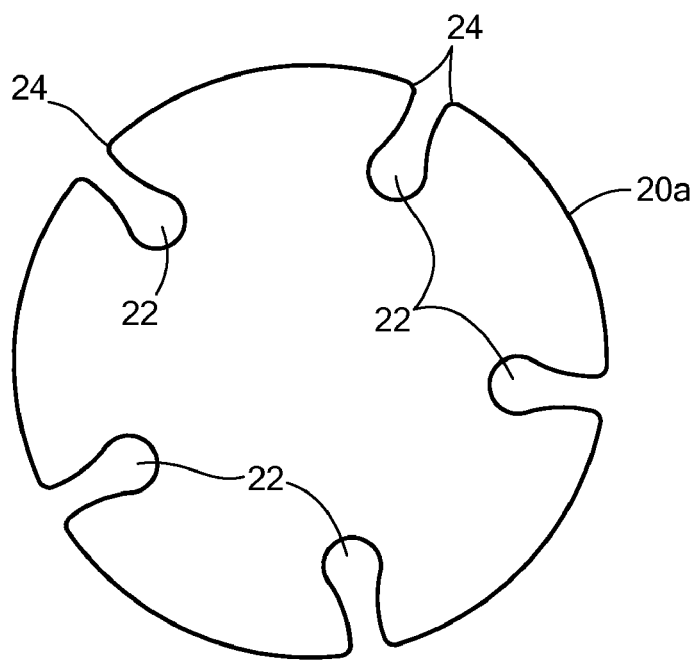

For example, FIG. 3A schematically shows a backside cavity 20 having numerous ribs 22 and vertices 24 in the sidewalls 20a giving the cavity 20 a serrated shape. FIG. 3B schematically shows a backside cavity 20 having curved and substantially straight sidewalls 20a with multiple ribs 22 protruding toward the center of the cavity 20. FIG. 3C schematically shows a backside cavity 20 having substantially straight sidewalls 20a with multiple ribs 22 and vertices 24. FIG. 3D schematically shows a backside cavity 20 having curved sidewalls 20*a* with rounded ribs 22 protruding toward the center of the cavity 20. FIG. 3E schematically shows a backside cavity 20 having substantially straight sidewalls 20*a* with ribs 22 having different shapes. For example, as shown, some of the ribs 22 may have more than one point 22*a* whereas other ribs 22 may have only one point 22*a*, although various combination of rib 22 shapes, e.g., rounded or sharp, may used.

Alternatively, as shown in FIGS. 4A and 4B, the backside cavity 20 may have sidewalls 20*a* with one or more vertices 24 without any corresponding ribs 22 protruding inward toward the center of the cavity 20, giving the cross-sectional view of the backside cavity 20 a non-rectangular shape. As mentioned above, the sidewalls 20*a* of the backside cavity 20 may be curved, substantially straight, or both. Also, the shape of the backside cavity 20 is not necessarily symmetric and any number of vertices 24 may be used. The vertices 24 should be sufficiently pointed to overcome the surface tension of the liquid, thus permitting the liquid to wet the interior of the backside cavity 20. For example, each vertex 24 may be considered to form an angle 24*a* that faces the interior of the backside cavity 20. In illustrative embodiments, these angles 24*a* may be less than about 90 degrees. In other embodiments, the angles may be between about 90 and 180 degrees. It is anticipated that angles much less than 90 degrees (e.g., five degrees) should have a more substantial impact on overcoming the surface tension of the liquid. Although it has not been tested, it nevertheless is anticipated that angles between 90 and 180 degrees will not perform as well as the other noted angles. However, it also is anticipated that such angles still should perform adequately for a given application. Nevertheless, it should be noted that the angles may be selected as a function of the surface tension of the liquid. For example, the angles may be selected based upon the surface tension of the liquid etchant, e.g., hydrofluoric acid, used to remove oxide from the interior walls of the through-holes 18. Some embodiments may enhance the effect of the vertices 24 by increasing the roughness of the sidewalls 20*a* of the backside cavity 20. Some of the roughened areas may effectively form much smaller vertices 24.

Discussion of specific shapes herein is not intended to imply that only those shapes may be used. Instead, those skilled in the art should understand that any of a plurality of shapes may be used with one or more ribs 22 and/or one or more vertices 24. Therefore, one skilled in the art may conduct tests and empirical studies to determine a sufficient shape for the backside cavity 20 for a given application.

Figure 5:
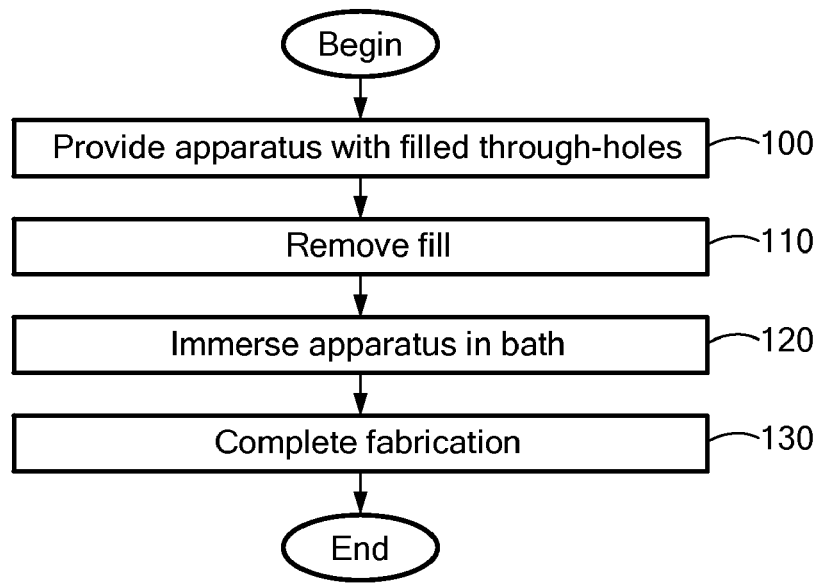
FIG. 5 shows a process of forming a MEMS microphone in accordance with illustrative embodiments of the invention.

FIG. 5 shows an illustrative process of forming a MEMS microphone 10 with its backside cavity 20 configured in the described manner. It should be noted that this process only discusses a few steps of an overall process that may have numerous steps. Accordingly, discussion of this process should not be interpreted as only requiring the discussed steps.

The process begins at step 100, which provides an apparatus that ultimately will be processed into the MEMS microphone 10. Specifically, among other things, this apparatus already has its diaphragm 16, backplate 14 with through-holes 18, and backside cavity 20. In this embodiment, however, as is common in various MEMS processes, the space between the diaphragm 16 and backplate 14, as well as the through-holes 18, are filled with a fill material (not shown in FIG. 1A).

More particularly, when processing the MEMS microphone 10, those skilled in the art typically add a fill material to the noted spaces to facilitate the planar processing of the apparatus. Thus, before executing step 100, the process may oxidize the exposed surfaces of the through-holes 18 and diaphragm 16, and then fill those spaces with a fill material, e.g., polysilicon. Accordingly, at step 100, the through-holes 18 are filled with a fill material (in this example).

The process then continues to step 110, which removes the fill material. For example, if the fill material is polysilicon, then the process may expose the fill material to an etchant, e.g., xenon difluoride, in a gas state. The etchant should effectively remove the fill material, but leave some portion of the oxide on the exposed surfaces. As such, the oxide may be considered to be a barrier between the MEMS structure and the etchant.

Figure 6:
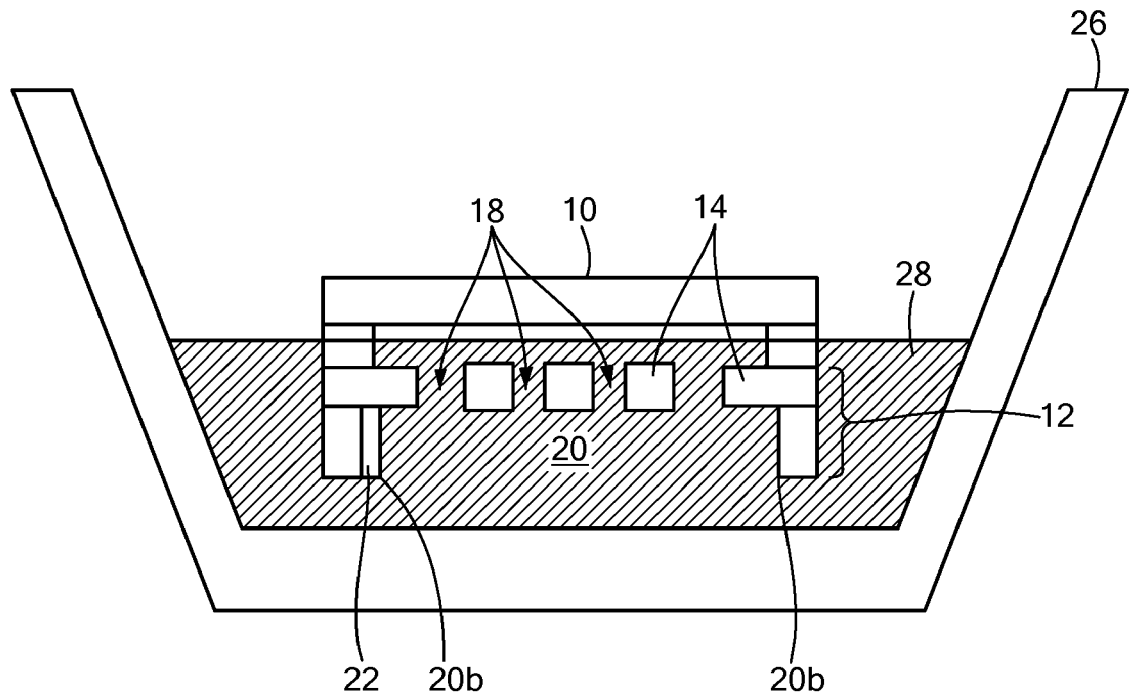
FIG. 6 schematically shows an example of a MEMS microphone at least partially immersed in a liquid bath.

Referring also to FIG. 6, after removing the fill material, the process continues by at least partially immersing the apparatus in a bath 26 of liquid etchant 28, e.g., hydrofluoric acid (step 120). The apparatus may be completely immersed or partially immersed in the liquid 28 for a predetermined amount of time to remove the oxide. Although FIG. 6 shows the apparatus being immersed in the liquid bath 26 in a substrate first manner, the apparatus may be immersed in other orientations or manners.

As discussed above, the shape of the backside cavity 20 should facilitate entry of the liquid 28 into the interior parts of the apparatus, thus facilitating oxide removal. In other words, the shape of the backside cavity 20 should substantially reduce the likelihood that a bubble forms over the mouth 20*b* of the backside cavity 20. Accordingly, various embodiments do not require additional mechanical or other means for breaking the bubble, such as forced air toward the mouth 20*b* of the backside cavity 20.

The process continues to step 130, which completes fabrication of the microphone 10. Specifically, among other things, the microphone 10 is removed from the liquid bath 26 and tested, packaged, or further processed by conventional micromachining techniques.

To improve fabrication efficiency, illustrative embodiments of the invention use batch processing techniques to form the MEMS microphone 10. Specifically, rather than forming only a single microphone, illustrative embodiments simultaneously form a two dimensional array of microphones on a single wafer. Accordingly, discussion of this process with a single MEMS microphone is intended to simplify the discussion only and thus, not intended to limit embodiments to fabricating only a single MEMS microphone.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a MEMS microphone, the method comprising:
    forming a backplate;
    forming a diaphragm movable relative to the backplate; and
    forming a backside cavity adjacent to the backplate or the diaphragm, the backside cavity having sidewalls with at least one rib protruding inward toward a center of the backside cavity, wherein the at least one rib is curved, the at least one rib has one or more points, or at least one rib is curved and at least one rib has one or more points.

2. The method as defined by claim 1 wherein the sidewalls of the backside cavity have a plurality of ribs forming a serrated pattern.

3. The method as defined by claim 1 wherein the at least one rib is formed near a bottom opening of the backside cavity.

4. The method as defined by claim 1 wherein the at least one rib extends along the sidewall from a bottom opening of the backside cavity to a top of the backside cavity.

5. The method as defined by claim 1 wherein the sidewalls are curved, substantially straight, or both.

6. A method of forming a MEMS microphone, the method comprising:
   forming a blackplate;
   forming a diaphragm movable relative to the backplate;
   forming a backside cavity adjacent to the backplate or the diaphragm, the backside cavity having sidewalls with at least one rib protruding inward toward a center of the backside cavity; and
   at least partially immersing the backplate in a liquid, the at least one rib being shaped to substantially prevent bubble formation when immersed and permit the liquid into the backside cavity.

7. A method of forming MEMS microphone, the method comprising:
   forming a backplate;
   forming a diaphragm movable relative to the backplate; and
   forming a backside cavity adjacent to the backplate or the diaphragm, the backside cavity having sidewalls with at least one rib protruding inward toward a center of the backside cavity, wherein the backplate includes at least one through-hole in fluid communication with the backside cavity, the through-hole having a material on its wall that is soluble in the liquid, the method further comprising at least partially immersing the backplate in the liquid to enable the liquid to contact the wall of the through-hole.

8. The method as defined by claim 7 wherein the material comprises an oxide and the liquid comprises a hydrofluoric acid.

9. A MEMS microphone comprising:
   a backplate;
   a diaphragm movable relative to the backplate; and
   a backside cavity adjacent to the backplate or diaphragm, the backside cavity having sidewalls with at least one rib protruding inward toward a center of the backside cavity, wherein the at least one rib is curved, the at least one rib has one or more points, or at least one rib is curved and at least one rib has one or more points.

10. The MEMS microphone as defined by claim 9 wherein the sidewalls of the backside cavity have a plurality of ribs protruding toward the center forming a serrated pattern.

11. The MEMS microphone as defined by claim 9 wherein the at least one rib is formed near a bottom opening of the backside cavity.

12. The MEMS microphone as defined by claim 9 wherein the at least one rib extends along the sidewall from a bottom opening of the backside cavity to a top of the backside cavity.

13. The MEMS microphone as defined by claim 12 wherein the at least one rib at least in part supports the backplate.

14. The MEMS microphone as defined by claim 9 wherein the sidewalls are curved, substantially straight, or both.

15. A MEMS microphone comprising:
   a backplate;
   a diaphragm movable relative to the backplate; and
   a backside cavity adjacent to the backplate or diaphragm, the backside cavity having a non-rectangular shape and sidewalls with at least one vertex and at least one rib protruding inward toward a center of the backside cavity, wherein the at least one rib is curved, the at least one rib has one or more points, or at least one rib is curved and at least one rib has one or more points.

16. The MEMS microphone as defined by claim 15 wherein the sidewalls are curved, substantially straight, or both.

17. The MEMS microphone as defined by claim 15 wherein the backside cavity further comprises at least one rib formed in the sidewalls.

18. The MEMS microphone as defined by claim 15 wherein the at least one vertex forms an angle facing an interior of the backside cavity, the angle being less than about 90 degrees.

* * * * *